(12) United States Patent  
Katti (10) Patent No.: US 7,359,235 B2  
(45) Date of Patent: Apr. 15, 2008

(54) SEPARATE WRITE AND READ ACCESS ARCHITECTURE FOR A MAGNETIC TUNNEL JUNCTION

(75) Inventor: Romney R. Katti, Shorewood, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/847,122

(22) Filed: Aug. 29, 2007

(65) Prior Publication Data

US 2007/0291530 A1    Dec. 20, 2007

Related U.S. Application Data

(63) Continuation-in-part of application No. 10/754,880, filed on Jan. 10, 2004.

(51) Int. Cl.  
*G11C 11/00* (2006.01)

(52) U.S. Cl. .................. 365/158; 365/171; 365/173

(58) Field of Classification Search ............ 365/158, 365/171, 173  
See application file for complete search history.

(56) References Cited

U.S. PATENT DOCUMENTS

| 6,391,483 | B1 | 5/2002 | Zhu et al. .............. 428/692 |
| 6,498,747 | B1 | 12/2002 | Gogl et al. .............. 365/158 |
| 6,522,573 | B2 | 2/2003 | Saito et al. .............. 365/158 |
| 6,730,949 | B2 * | 5/2004 | Kishi et al. .............. 257/295 |
| 6,781,910 | B2 * | 8/2004 | Smith ................ 365/225.5 |

(Continued)

FOREIGN PATENT DOCUMENTS

WO    WO 02/084706 A2    10/2002

OTHER PUBLICATIONS

Scheuerlein, Roy E., "Magneto-Resistive IC Memory Limitations and Architecture Implications", Nonvolatile Memory Technology Conference, 1998. 1998 Proceedings. Seventh Biennial IEEE Alburqueque, NM, USA Jun. 22-24, 1998, New York, NY, USA, IEEE, US, Jun. 22, 1998, pp. 47-50, XP00309468.

(Continued)

*Primary Examiner*—Gene N. Auduong  
(74) *Attorney, Agent, or Firm*—McDonnell Boehnen Hulbert & Berghoff LLP (57) ABSTRACT

A magnetoresistive device is provided with separate read and write architecture. In one embodiment, a magnetic tunnel junction (MTJ) has a nonmagnetic nonconductive barrier layer sandwiched between two ferromagnetic conducting layers. A first read line having a first resistance is coupled to a first ferromagnetic layer and a second read line having a third resistance is coupled to a second ferromagnetic layer such that a voltage difference between the two read lines will produce a current flowing perpendicularly through each layer of the MTJ. A first write line having a second resistance is separated from the first read line by a first insulator and a second write line having a fourth resistance is separated from the second read line by a second insulator, and wherein the second and fourth resistances are lower than the first and third resistance.

14 Claims, 6 Drawing Sheets

U.S. PATENT DOCUMENTS

| | | | |
|---|---|---|---|
| 6,885,582 B2* | 4/2005 | Sharma | 365/173 |
| 6,897,101 B2 | 5/2005 | Weitz | 438/171 |
| 6,901,005 B2* | 5/2005 | Perner et al. | 365/158 |
| 6,912,152 B2 | 6/2005 | Iwata et al. | 365/158 |
| 2004/0001368 A1* | 1/2004 | Huggins | 365/200 |
| 2005/0152180 A1 | 7/2005 | Katti | |

OTHER PUBLICATIONS

Slaughter, "Magnetic Tunnel Junction Materials for Electronics Applications," JOM (Jun. 2000). (www.tms.org/pubs/journals/JOM/0006/Slaughter/Slaughter-0006.html).

Daughton, "Magnetoresistive Random Accesss Memory (MRAM)," pp. 1-13 (Feb. 4, 2000).

* cited by examiner

SEPARATE WRITE AND READ ACCESS ARCHITECTURE FOR A MAGNETIC TUNNEL JUNCTION

RELATED APPLICATIONS

This application is continuation in part of U.S. patent application Ser. No. 10/754,880, filed on Jan. 10, 2004.

GOVERNMENT RIGHTS

The United States Government has acquired certain rights in this invention pursuant to Contract No. DTRA01-00-C-0002 awarded by DTRA.

BACKGROUND

1. Field of Invention

The present invention relates generally to magnetic memory and more specifically to a memory device that utilizes the magnetoresistive effect to store binary data.

2. Description of the Related Art

Figure 1:
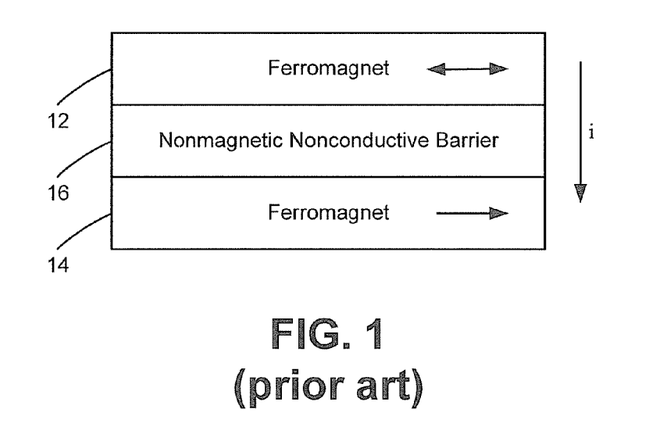
FIG. 1 is a schematic diagram of the layers of a prior art magnetic tunneling junction (MTJ) element.

Many advances in memory technology have been made in recent years. One such advance is the magnetic tunnel junction (MTJ) that makes use of the tunneling magnetoresistive effect to store binary information. MTJs are favored because they provide high data read speeds, are nonvolatile, and have a high magnetoresistive ratio. The basic structure of the MTJ is shown in FIG. 1 as tri-layer device having a barrier layer 16 sandwiched between magnetic (ferromagnetic) layers 12 and 14. Each magnetic layer has an associated magnetization direction.

In a typical arrangement, one of the magnetic layers is configured to be a fixed layer 14. An anti-ferromagnetic layer (not shown) may be useful in fixing the magnetization direction of the fixed layer. Thus, the fixed layer is treated substantially like a permanent magnet with a permanent direction. The single headed arrow in layer 14 indicates that layer 14 is a fixed layer with a fixed magnetic direction. A second magnetic layer is termed a free layer 12. The free layer 12 is configured to switch the direction of its magnetization in response to an applied magnetic field of sufficient magnitude. The double headed arrow at free layer 12 indicates that the magnetization direction of the free layer 12 may be inverted by an applied magnetic field.

In order to store binary data, the MTJ must have two possible logical states (i.e. binary states). These states are often referred to as "1" and "0." The state of the MTJ is defined by whether the magnetization directions of the two magnetic layers 12 and 14 are parallel or anti-parallel. If the magnetization directions the two magnetic layers 12 and 14 are the same then they are said to be parallel. Alternatively, if the magnetization directions of the two magnetic layers are opposite, they are said to be anti-parallel.

The tunneling magnetoresistive effect is based on the phenomena that an applied magnetic field can influence the resistivity of a material. In simple terms, the resistance to a current passing through the MTJ is "high" when the magnetization directions of the magnetic layers are anti-parallel and "low" when the magnetization directions are parallel. Usually, the resistivity of an MTJ is determined by measuring a read current passed perpendicularly through each layer of the MTJ. A read current (i) is shown passing perpendicularly through the layers of FIG. 1. Because of the direction of read current flow, an MTJ is termed a current perpendicular to plane (CPP) device.

One measure for the quality of an MTJ is its magnetoresistive ratio defined as ($\Delta R/R_{max}$). $\Delta R$ is defined as the difference between the resistivity of the MTJ when the magnetization directions are anti-parallel and the resistivity of the MTJ when the magnetization directions are parallel, while $R_{max}$ is the resistivity of the MTJ when the magnetization directions are anti-parallel (maximum resistivity).

When writing to the MTJ, the magnetization direction of the free layer 12 is switched by applying a magnetic field to the MTJ. Usually, a pair of conducting lines running perpendicularly to one another are used to apply the external magnetic field to the MTJ for writing. These lines may be termed a bit line and a digit line. The bit line may also be used to apply the read current.

SUMMARY

A magnetic tunnel junction (MTJ) memory device with separate write and read access is disclosed. In a first principal aspect, a magnetoresistive cell provides an MTJ element having a magnetic free layer and a magnetic pinned layer separated by a barrier layer, two read lines for reading a binary state of the MTJ element, and two write lines for setting the binary state of the MTJ element. The first read line is coupled to the free layer of the MTJ element, and the second read line is coupled to the pinned layer of the MTJ element. Thus, a current in the first read line will pass perpendicularly through each layer of the MJT element before arriving at the second read line. The binary state of the MTJ element may be switched by an externally applied magnetic field. In this embodiment, the magnetic field for writing is created by currents passing through the two write lines. The two write lines are insulated from the read lines and the MTJ element.

In one embodiment, the first read line has a first resistance and the first write line has a second resistance. Further, the second read line has a third resistance and the second write line has a fourth resistance, in which the second and fourth resistances are lower than the first and third resistance. In the same embodiment and/or in another embodiment, the first and third resistances are substantially equal to each other and the second and fourth resistances are substantially equal to each other. In an alternative embodiment, the first and second write lines are made of a first material and the first and second read lines is made of a second material, wherein the first material has a lower resistance than the second material.

The relative orientation of the four lines associated with each MTJ element may take several forms. In one embodiment, a first write line and the first read line run perpendicular to a second write line and the second read line. In an alternative embodiment, the first write line and the second read line run perpendicular to the second write line and the first read line.

In a second principal aspect, a magnetic random access memory (MRAM) provides for a matrix of MTJ cells arranged in rows and columns. Each row is configured to have two lines (a first read line and a first write line) passing along its distance. The first read line is coupled to a first side of each MTJ cell in the row while the first write line is isolated from the first read line and from the MTJ cells. Similarly, each column is configured to have two lines (a second read line and a second write line) passing along its distance. The second read line is coupled to a second side of each MTJ cell in the column while the second write line is isolated from the second read line and from the MTJ cells.

Additionally, the MRAM provides control circuitry for performing read and write functions.

DETAILED DESCRIPTION

1. Overview

Figure 2:
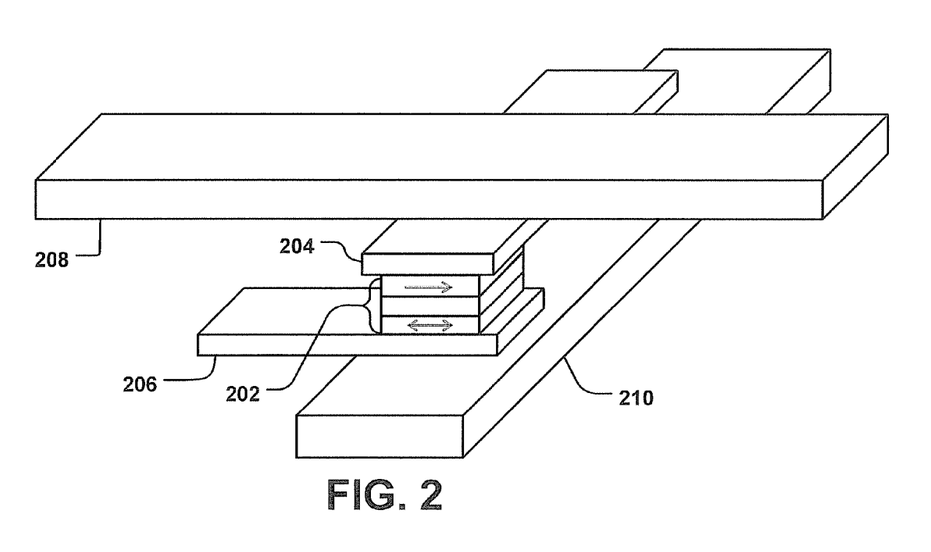
FIG. 2 is an isometric view of an embodiment of a magnetic tunnel junction device.

Referring to the drawings, FIG. 2 generally depicts a magnetic tunnel junction (MTJ) cell with separate read and write architecture. An MTJ element 202 is shown as a tri-layer element having a barrier layer sandwiched between two conducting magnetic layers. Each magnetic layer of the MTJ element 202 has a magnetization direction. In FIG. 2, the top magnetic layer is shown with a single headed arrow indicating that the magnetization direction of the top magnetic layer does not change during operation of the cell. Thus, the top magnetic layer is known as the pinned layer. The bottom magnetic layer is shown with a double headed arrow indicating that the magnetization direction of the bottom magnetic layer can be inverted during operation of the cell. Thus, the bottom magnetic layer is known as the free layer. As one skilled in the art will recognize, the orientation of the layers can be altered without eliminating the usefulness of the MTJ element 202.

A first read line 204 is coupled to a first side of the MTJ element 202 and a second read line 206 is coupled to a second side of the MTJ element 202. The two read lines are arranged such that a voltage difference between the first read line 204 and the second read line 206 will generate a current flowing perpendicularly through the layers of the MTJ element 202. The first read line 204 is generally arranged to run perpendicular to the second read line 206. However, as one skilled in the art will understand, this arrangement is not necessary. For example, in another embodiment, the second read line 206 does not run perpendicular to first read line 204, but rather terminates at a ground after passing through a select transistor.

A first write line 208 is shown above the first read line 204. The first write line 208 is separated from the first read line 204 and from the rest of the cell by a first insulative spacer (not shown). The first write line 208 is arranged near the MTJ element 202 such that a current passing through the first write line 208 creates a magnetic field that acts on the MTJ element 202.

A second write line 210 is shown below the second read line 206. The second write line 210 is separated from the second read line 206 and from the rest of the cell by a second insulative spacer (not shown). The second write line 210 is arranged near the MTJ element 202 such that a current passing through the second write line 210 creates a magnetic field that acts on the MTJ element. The first write line 208 is generally arranged to run perpendicular to the second write line 210. However, as one skilled in the art will understand, this arrangement is not necessary.

A logical state of the cell depends upon the relative orientation of the magnetization directions of the magnetic layers of the MTJ element 202. Thus, the logical state of the cell is set by orientating the magnetization layers. A first current passing through the first write line 208 and a second current passing through the second write line 210 create a combined magnetic field. The combined magnetic field acts on the MTJ element 202 to invert the orientation of the magnetization direction of the free layer of the MTJ element 202.

To determine the logical state of the MTJ element 202, a voltage difference is created between the first read line 204 and the second read line 206. The voltage difference results in a current passing perpendicularly through the layers of the MTJ element 202. The value of the current is indicative of the logical state of the MTJ element.

2. MTJ Cell Architecture

Figure 3A:
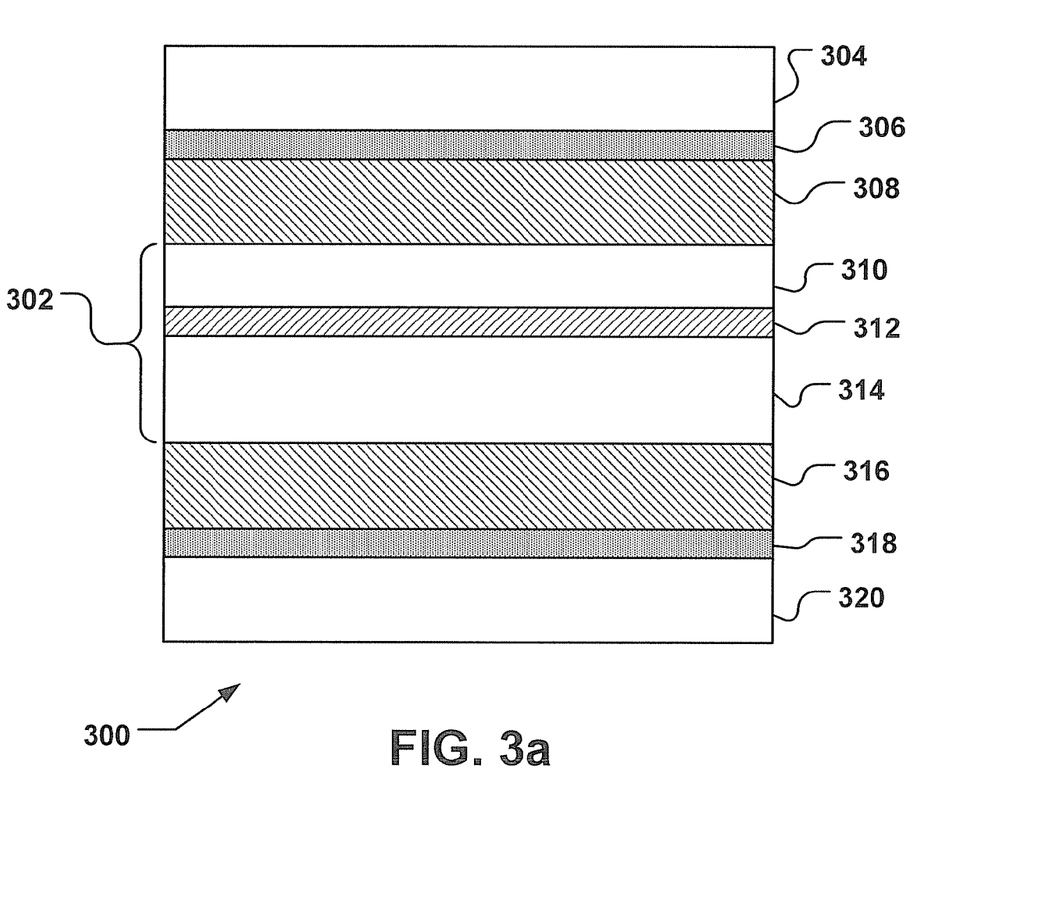
FIG. 3a is a schematic diagram of the embodiment of FIG. 2 with minor alterations.

FIG. 3a shows a block diagram of an MTJ cell 300 in accordance with an exemplary embodiment. An MTJ element 302 is shown as a tri-layer element having a nonmagnetic nonconducting barrier layer 312 sandwiched between a conducing magnetic free layer 310 and a magnetic conducting pinned layer 314. A first read line 308 is coupled to the free layer 310 and a second read line is coupled to the pinned layer 314. A first insulator 306 separates a first write line 302 from the first read line 308. A second insulator 318 separates a second write line 320 from the second read line 316.

Insulating layers 306 and 318 may be dielectric layers. For example, insulating layers 306 and 318 may each be a silicon dioxide ($SiO_2$) layer and/or a silicon nitride ($Si_3N_4$) layer.

The barrier layer 312 is preferably a thin film insulator. During a read sequence, a current is passed through the barrier layer 312. According to classical physics, this operation is not possible because the resistance across the barrier layer 312 should be infinity. However, at a nanometric scale, a tunneling current may flow in such a structure. The barrier layer may, for example, be manufactured by deposition on one of the ferromagnetic layer a 1-2 nm thick film of Al or Mg. The film is then oxidized to obtain an $Al_2O_3$ or MgO insulation layer. Various techniques of oxidation are applicable, for example plasma oxidation, thermal oxidation, oxygen glow discharge or direct deposition of $Al_2O_3$. Epitaxially grown barrier layers may also be incorporated in the present invention. For example, an MgO barrier layer may be elaborated by molecular beam epitaxy with a barrier layer thickness of approximately 0.8 nm. Care must be taken when producing the barrier layer to avoid pinholes and other impurities that could serve to electrically or magnetically couple the two ferromagnetic layers 310 and 314.

In an exemplary embodiment, the two ferromagnetic layers 310 and 314 that bound two sides of the barrier layer 312 are magnetically uncoupled from one another, and are designed to exhibit switching behavior similar to a spin valve. The two ferromagnetic layers may be designed with different coercivities. For example, the pinned layer 314 is shown as thicker than the free layer 310 to indicate a greater coercivity. Additionally, the pinned layer 314 may be exchange biased by MnFe or through, for example, an Co/Ru/Co layer. Thus, in this case, the pinned layer 314 becomes a magnetic multilayer with a magnetizable reference layer and a pinning layer. Because the read sequence involves passing a current perpendicularly through the plane of each layer, the exchange biasing layers (pinning layers) must be electrical conductors. As another example, the magnetic layers may be NeFe alloys.

Figure 3B:
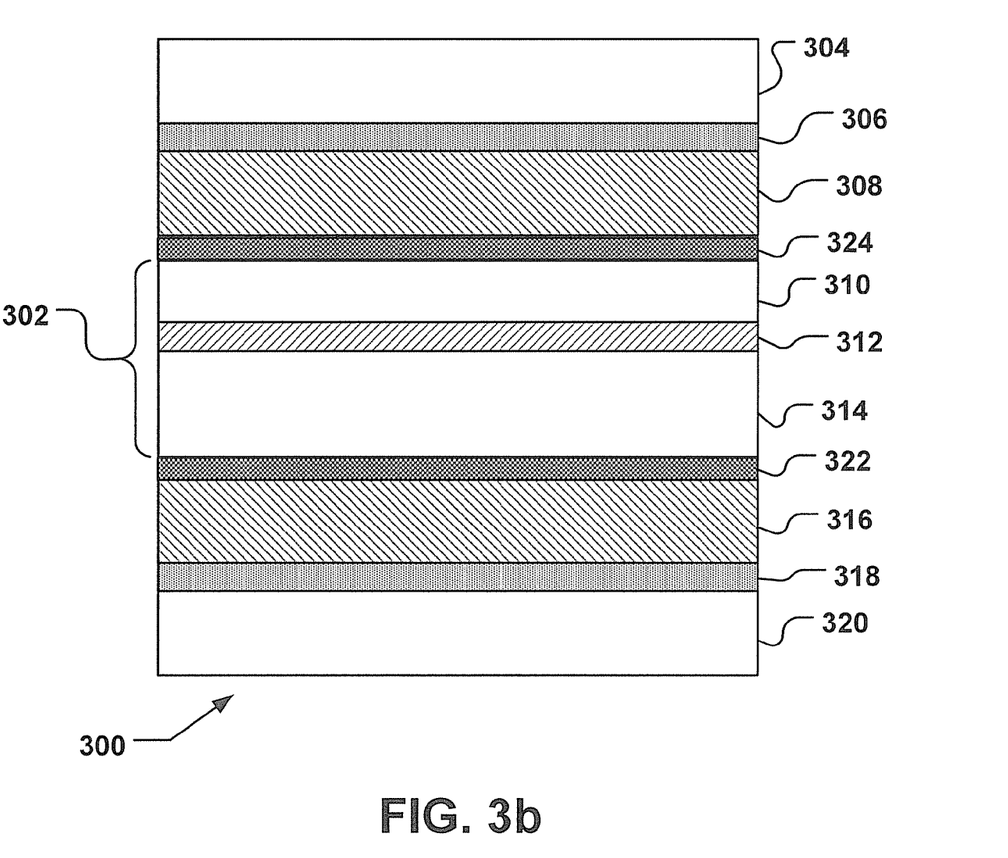
FIG. 3b is a schematic diagram of the embodiment of FIG. 2 with minor alterations.

In one embodiment, the read lines 308 and 316 are each directly coupled to the MTJ element 302. Alternatively, insulating layers are deposited between the read lines 308 and 316 and the MTJ element 302. In this case, as shown in FIG. 3b, an electric connection between the read lines 308 and 316 and the MTJ element 302 is maintained through vias 322 and 324. Either one or both of the vias may be used. Preferably via 322 and 324 are thin layers to minimize the distance between the write lines 304 and 320. Additionally, vias 322 and 324 may comprise of a low resistance material or high resistance materials such as tungsten or tantalum.

The write lines 304 and 320 are preferably thicker than the read lines 308 and 316. As the number of cells in a memory device increase, the write lines 304 and 320 may need to support large array of cells at low supply voltages. To ensure that the write lines remain effective in large arrays of cells, it would be beneficial to keep the resistance of the write lines as low as possible. For at least this reason, the cross-sectional area of write lines 304 and 320 may be increased by making write lines 304 and 320 thicker than read lines 308 and 316. The resistance of the write line 304 may be substantially equal to the resistance of the write line 320. And the resistance of the read line 308 may be substantially equal to the read line 316.

The write lines 304 and 320 could be made of lower resistivity materials such as Aluminum (Al), Copper (Cu), and/or Aluminum Copper alloys.

In yet another embodiment, the thickness of insulating layers 306 and 318 may be reduced. By reducing the thickness of the insulating layers 306 and 318, write lines 304 and 320 may be closer to MTJ 302. In effect, the power consumption of write lines 304 and 320 may reduce. And the magnetic field efficiency of the write lines 304 and 320 may increase.

Additionally and/or alternatively, the thickness of read lines 308 and 316 may be reduced. This may minimize the distance between the write lines 304 and 320 and MTJ 302. In one embodiment, read lines 308 and 316 may be made of low resistance materials such as Aluminum (Al), Copper (Cu), and alloys such Aluminum Copper alloys. Other materials that that have low resistances may be also be used. In another embodiment, read lines 308 and 316 may be made of high resistance materials, such as Tantalum (Ta) and/or tantalum nitride (TaN). Other materials that have high resistances may also be used.

3. Manufacturing the Cell

The steps of manufacturing of an embodiment of an MTJ cell are described below. Beginning with a silicon substrate (not shown), a second write line 320 is deposited on the substrate. After a second insulator 318 is deposited on the second write line 320, a second read line 316 is deposited. An MTJ 302 is grown upon the second read line 316 either directly or on an insulator (not shown) that provides interconnects the second read line 316 and the MTJ 302 through a via. A first read line 308 is deposited on the MTJ 302, either directly or on an insulator (not shown) that interconnects the first read conductor and the MTJ 302 through a via. A first write line 304 is deposited on a first insulator 306 above the first read line 308. The write and read lines 304, 308, 316, and 320 may be arranged to run in a matrix of rows and columns in which contacts are made to access transistors (not shown) for controlling current flow in the lines.

4. MTJ Array

Figure 4A:
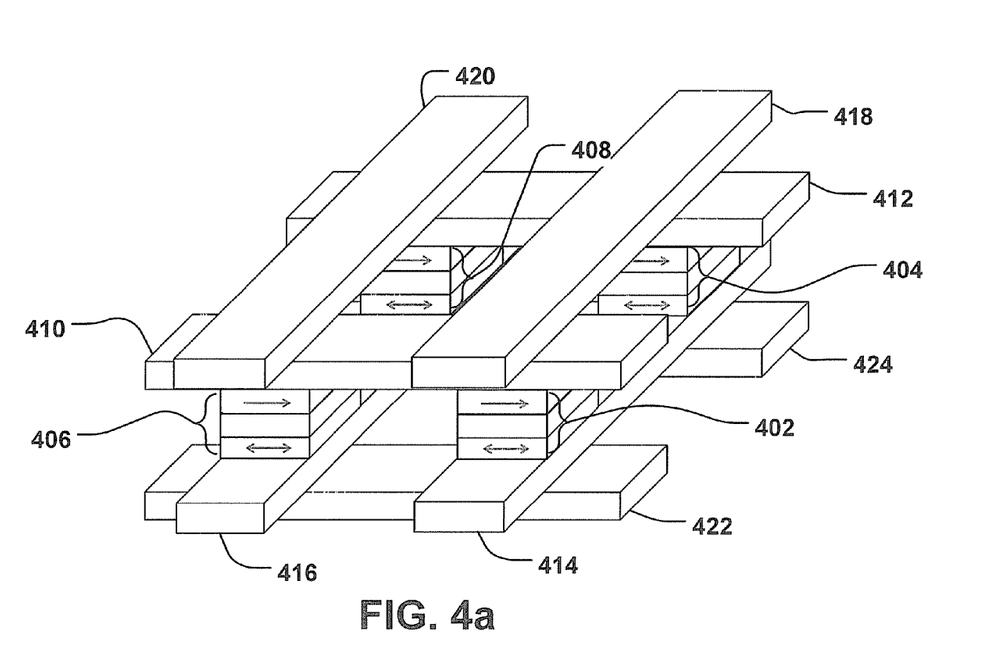
FIG. 4a is an isometric view of a portion of a memory matrix showing an embodiment of four magnetic tunnel junction cells and their interconnection.

FIG. 4a is a schematic diagram of an array of MTJ cells arranged in accordance with an exemplary embodiment. An array of MTJ cells, such as for a magnetic random access memory (MRAM) application, may be constructed of a very large number of MTJ cells. For simplicity, FIG. 4a shows an array of only four MTJ elements 402, 404, 406, and 408. The array shown has two rows and two columns. One of skill in the art will readily recognize that the number of MTJ elements can be increased by increasing the number of rows and/or columns. Two row read lines 410 and 412 are shown—one for each row. One row read line is attached to each MTJ element in the corresponding row. Thus, for example, a first row read line 410 is attached to MTJ elements 402 and 406, while a second row read line 412 is attached to MTJ elements 404 and 408. Two column read lines 414 and 416 are shown—one for each column. Each column read line is attached to each MTJ element in its row. Thus, in this arrangement the column read lines 414 and 416 are aligned perpendicularly to the row read lines 410 and 412. Looking specifically at read lines 410 and 414 as examples: a voltage difference between row read line 410 and column read line 414 will cause a current to pass through MTJ element 402. In this way, the resistivity of MTJ element 402 can be determined and consequently its logical state. In one embodiment a first switch is coupled to row read line 410 and a second switch coupled to column read line 414. When both the first switch and the second switch are closed, a read current is passed through MTJ element 402 for determining the logical state of the MTJ element 402.

FIG. 4a also shows two sets of write lines. Two column write lines 418 and 420 are arranged near the row read lines 410 and 412. The column write lines 418 and 420 are insulated from the row read lines 410 and 412 and from the MTJ elements. Two row write lines 422 and 424 are also shown and are arranged near the column read lines 414 and 416. The row write lines 422 and 424 are insulated from the column read lines 414 and 416 and from the MTJ elements. Looking specifically at write lines 418 and 422 as examples: a first current passed through column write line 418 and a second current passed through row write line 422 create a combined magnetic field that acts on MTJ element 402. If the combined magnetic field is sufficient, the magnetization direction of the free layer of MTJ element 402 will be inverted.

Figure 4B:
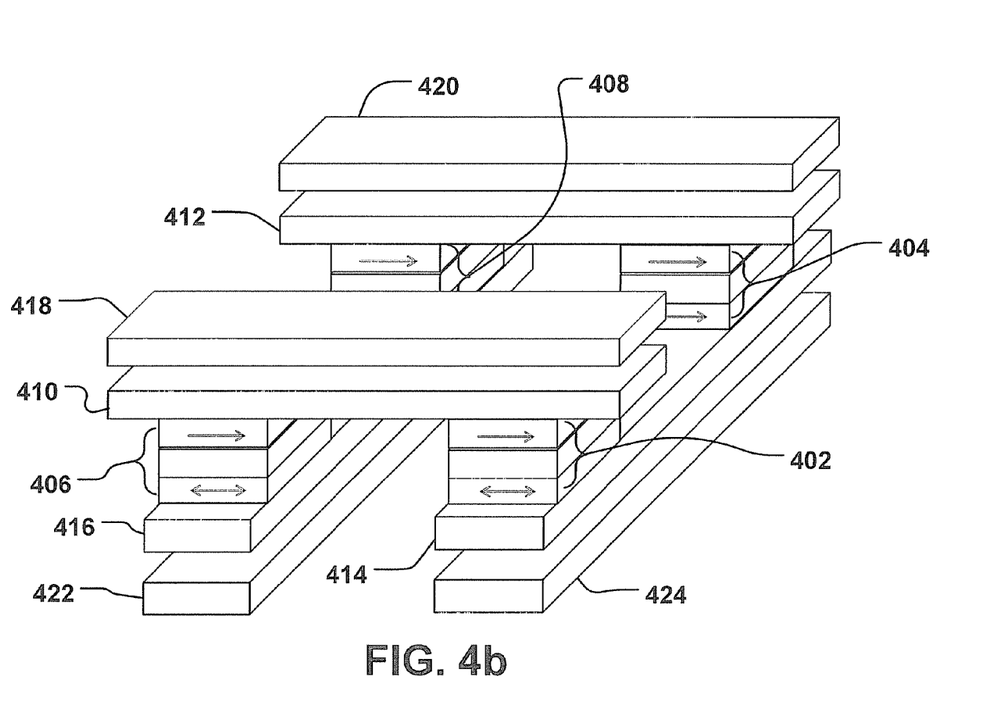
FIG. 4b is an isometric view of a portion of a memory matrix showing a second embodiment of four magnetic tunnel junction cells and their interconnection.

In FIG. 4a, write lines that are deposited above the MTJ elements are arranged perpendicularly to read lines that are deposited above the MTJ elements. Likewise write lines that are deposited below the MTJ elements are arranged perpendicularly to read lines that are deposited below the MTJ elements. An alternative arrangement is shown by FIG. 4b. In FIG. 4b, write lines run parallel to their corresponding read lines. For example, write lines 418 and 420 are deposited above the MTJ elements 402-408 and run parallel to read lines 410 and 412 that are also deposited above the MTJ elements 402-408.

5. MTJ Array and Control Circuitry

Figure 5:
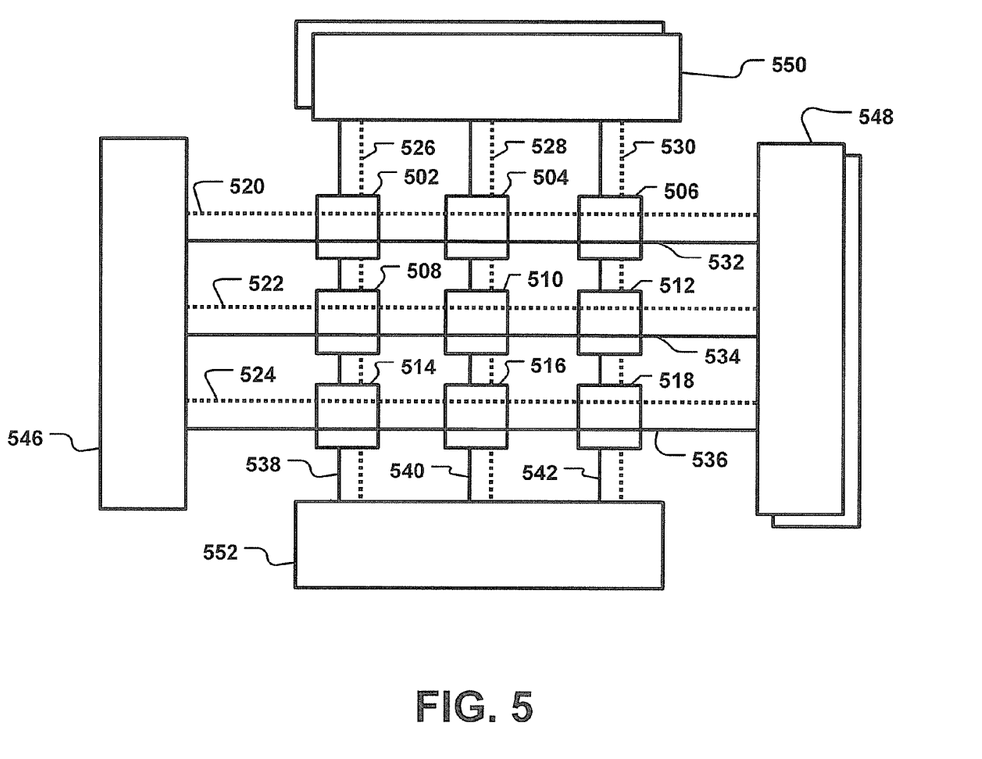
FIG. 5 is a block diagram of an embodiment of a memory matrix.

FIG. 5 is a block diagram of an MTJ array that could be used in a memory device in accordance with an embodiment of the invention. Elements 502-518 represent MTJ elements such as those shown in FIGS. 1-2. The MTJ elements are arranged in a set of rows and columns. For example, MTJ elements 502, 504, and 506 are arranged in the same row while MTJ elements 502, 608, and 514 are arranged in the same column. In this embodiment, only nine MTJ elements are shown in a set of three rows and three columns. This limited set serves as an example. In practice a much larger array may be employed.

Each row in the array has two associated lines: one read line and one write line. Row read lines 520, 522, and 524 are attached to a first side of each MTJ element in their respective rows. For example, row read line 520 is attached to a first side of each of MTJ elements 502, 504, and 506. Row write lines 532, 534, and 536 are arranged near each MTJ element in their respective rows. For example, row write line 532 is arranged near MTJ elements 502, 504, and 506 such that a current passing through the row write line 532 will create a magnetic field acting on MTJ elements 502, 504, and 506. The row write lines are not electrically coupled with the MTJ elements. Row control circuitry 546 and 548 is shown at the ends of rows. Row control circuitry generates the currents that pass through the lines of the rows.

Each column in the array has two associated lines: one read line and one write line. Column read lines 526, 528, and 530 are attached to a second side of each MTJ element in their respective columns. For example, column read line 526 is attached to a second side of MTJ element 502, 508, and 514. Column write lines 538, 540, and 542 are arranged near each MTJ element in their respective columns. For example, column write line 538 is arranged near MTJ elements 502, 508, and 514 such that a current passing through column write line 538 will create a magnetic field acting on MTJ element 502, 508, and 514. The column write lines are not electrically coupled with the MTJ elements. Column control circuitry 550 and 552 is shown at the ends of columns. The column control circuitry 550 and 552 generates the currents that pass through the lines of the rows.

In one embodiment, control circuitry also contains a sensor for determining the logical state of a selected MTJ element. The sensor, for example, may be an ammeter for measuring a current passing through the selected MTJ element or a voltmeter for measuring voltage across a selected MTJ element. More generally, control circuitry is provided for performing read and write functions.

In an embodiment, the control circuitry provides for a plurality of row access gates each associated with one row and each configured to switch between the corresponding row read line and row write line. For example, a first row access gate may be configured to switch between row read line 520 and row write line 532. Each row access gate is coupled to a row current supply that provides current to the rows. Similarly, the control circuitry provides for a plurality of column access gates each associated with one column and each configured to switch between the corresponding column read line and column write line. For example, a first column access gate may be configured to switch between column read line 526 and column write line 538. Each column access gate is coupled to a column current supply. Thus, during a write sequence of, for example, MTJ element 502, the first row access gate is switched so that the row access gate interconnects the row current supply with the row write line 532, and the first column access gate is switched so that the first column access gate interconnects the column current supply with column write line 538.

Another embodiment provides for a row current supply at control circuitry 546 and a row drain at control circuitry 548. A first row switch is coupled to the row current supply for selecting a selected row and a selected row-line of the selected row for delivering a current to the selected row-line. A second row switch for selecting the selected line is coupled to the row drain.

Likewise, a column current supply is located at control circuitry 550 and a column drain at control circuitry 552. A first column switch is coupled to the column current supply for selecting a selected column and a selected column-line of the selected column for delivering a current to the selected line. A second column switch for selecting the selected column-line is coupled to the column drain. In addition, the embodiment provides for a sensor for determining the logical state of the selected MTJ cell. The sensor may be, for example, an ammeter or a voltmeter.

Thus, in this embodiment, a read sequence of a selected MTJ cell (e.g. MTJ element 502) may be performed by selecting row read line 520 with the first row switch and by selecting column read line 526 with the second column switch. A current passes along a read arc from the row current supply to the column drain. The read arc also passes through the selected MTJ cell 502. By sensing either current flow or voltage drop, the device is able to determine the logical state of the selected MTJ cell 502.

Similarly, a write sequence of the selected MTJ cell 502 may be performed by selecting row write line 532 with both the first row switch and the second row switch. Additionally the column write line 538 is selected with both the first column switch and the second column switch. A current passes through both of the selected write lines and creates a combined magnetic field directed at the selected MTJ cell 502. If the combined magnetic field is sufficient, the magnetization direction of the selected MTJ cell 502 will invert—thus switching the logical state of the selected MTJ cell 502.

Although the MTJ elements of FIG. 5 are square in shape, it should be understood that they may be formed in a number of shapes including rectangular and elliptical. In a preferred embodiment, an MTJ element is formed with a long axis (easy axis) and a short axis (hard axis). The magnetization direction is generally found along the long axis of the MTJ element.

In another embodiment, multiple switches are used in each control circuitry 546-552. Thus, for example, a current may pass through two or more switches in its path from the row current supply to the row read line 520. For example, a first switch may select the selected row while a second switch selects either a read line or a write line. In an embodiment, the switches have an open position where no lines are selected.

As will be understood by those skilled in the art, each MTJ cell may represent a pair of MTJ elements arranged to have complementary logical states as a redundancy (complementary MTJ elements). In a write mode, the complementary MTJ elements may be arranged such that the same write lines are used to switch the respective states of the complementary MTJ elements. In another embodiment a row write line passes near both of the complementary MTJ elements while a single column write line does not pass near both of the complementary MTJ elements. Additionally, latching circuitry, such as, for example, a flip-flop, may be provided within each cell to store the logical value of the MTJ element.

6. Conclusion

A variety of embodiments have been described above. More generally, those skilled in the art will understand that changes and modifications may be made to these embodiments without departing from the true scope and spirit of the present invention, which is defined by the claims. Although the elements of the embodiments were assigned to rows and columns, these have been arbitrarily determined and may be switched without altering performance.

I claim:

1. A magnetoresistive memory cell comprising:
   a magnetic tunneling junction element having a first side and a second side;
   a first read line having a first resistance, wherein the first read line is coupled to the first side;
   a first write line having a second resistance, wherein the first write line is separated from the first read line by a first insulator;
   a second read line having a third resistance, wherein the second read line is coupled to the second side; and
   a second write line having a fourth resistance, wherein the second write line is separated from the second read line by a second insulator, and wherein the second and fourth resistances are lower than the first and third resistance.

2. The magnetoresistive memory cell of claim 1, wherein the first and third resistances are substantially equal to each other.

3. The magnetoresistive memory cell of claim 1, wherein the second and fourth resistances are substantially equal to each other.

4. The magnetoresistive memory cell of claim 1, wherein the first write line and the second write line are thicker than each of the first read line and the second read line.

5. The magnetoresistive memory cell of claim 1, wherein the first and second write lines are made of a first material and the first and second read lines is made of a second material, wherein the first material has a lower resistance than the second material.

6. The magnetoresistive memory cell of claim 1, wherein the magnetic tunnel junction element comprises a barrier layer sandwiched between a magnetic free layer and a magnetic pinned layer.

7. The magnetoresistive memory cell of claim 6, wherein the magnetic pinned layer comprises:
   a magnetizable reference layer; and
   an anti-ferromagnetic layer for pinning the magnetization direction of the magnetizable reference layer, wherein the magnetization direction of the magnetizable reference layer remains substantially fixed.

8. The magnetoresistive memory cell of claim 7, wherein the anti-ferromagnetic layer for pinning has a greater coercivity than the magnetizable reference layer.

9. The magnetoresistive memory cell of claim 1,
   wherein the first write line runs perpendicular to the second write line; and
   wherein the first read line runs parallel to the first write line, and
   wherein the second read line runs parallel to the second write line.

10. The magnetoresistive memory cell of claim 1,
    wherein the first write line runs perpendicular to the second write line; and
    wherein the first read line runs parallel to the second write line; and
    wherein the second read line runs parallel to the first write line.

11. The magnetoresistive memory cell of claim 1, further comprising:
    a ground; and
    a switch coupled between the second read line and the ground.

12. The magnetoresistive memory cell of claim 1, further comprising:
    a first switch coupled to the first read line; and
    a second switch coupled to the second read line, whereby a read current is passed through the cell when both the first switch and the second switch are closed.

13. The magnetoresistive memory cell of claim 1, further comprising an ammeter measuring the read current.

14. The magnetoresistive memory cell of claim 1, further comprising a voltmeter for measuring the voltage across the magnetic tunnel junction element.

* * * * *

UNITED STATES PATENT AND TRADEMARK OFFICE
CERTIFICATE OF CORRECTION

PATENT NO. : 7,359,235 B2  Page 1 of 1
APPLICATION NO. : 11/847122
DATED : April 15, 2008
INVENTOR(S) : Romney R. Katti It is certified that error appears in the above-identified patent and that said Letters Patent is hereby corrected as shown below:

Front Page (75) Inventor: Romney R. Katti, Shorewood, IL (US) should be --Inventor: Romney R. Katti, Shorewood, MN (US)--

Signed and Sealed this

Twenty-seventh Day of April, 2010

David J. Kappos
*Director of the United States Patent and Trademark Office*